United States Patent
Chu

(10) Patent No.: US 8,913,425 B2
(45) Date of Patent: Dec. 16, 2014

(54) PHASE CHANGE MEMORY MASK

(71) Applicant: Intel Corporation, Santa Clara, CA (US)

(72) Inventor: Daniel J. Chu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/796,462

(22) Filed: Mar. 12, 2013

(65) Prior Publication Data

US 2014/0269043 A1    Sep. 18, 2014

(51) Int. Cl.
*G11C 11/00*    (2006.01)
*G11C 13/00*    (2006.01)

(52) U.S. Cl.
CPC ........ *G11C 13/0004* (2013.01); *G11C 13/0069* (2013.01)
USPC ....................... 365/163; 365/148; 365/189.05

(58) Field of Classification Search
USPC .......................... 365/163, 148, 189.05, 189.16
See application file for complete search history.

(56) References Cited

U.S. PATENT DOCUMENTS

| 7,796,425 B2 * | 9/2010 | Choi et al. ..................... 365/163 |
| 7,889,544 B2 * | 2/2011 | Chow et al. ................... 365/163 |
| 8,223,529 B2 * | 7/2012 | Kim et al. ..................... 365/148 |
| 2011/0261613 A1 | 10/2011 | Pyeon |
| 2011/0261616 A1 | 10/2011 | Kim |
| 2012/0026786 A1 | 2/2012 | Castro et al. |
| 2012/0072657 A1 | 3/2012 | Lee et al. |

OTHER PUBLICATIONS

International Search Report and Written Opinion received for PCT Patent Application No. PCT/US2014/017938, mailed on May 26, 2014, 11 pages.
Cho et al., "Flip-N-Write: A Simple Deterministic Technique to Improve PRAM Write Performance, Energy and Endurance", Microarchitecture, 42nd Annual IEEE/ACM International Symposium on MICR0-42, Dec. 12-16, 2009, pp. 347-351.

* cited by examiner

*Primary Examiner* — David Lam
(74) *Attorney, Agent, or Firm* — Thorpe North & Western LLP

(57) ABSTRACT

Technology for writing data to a phase change memory array is disclosed. In an example, a method may include identifying mask logic for masking cells in the phase change memory array and routing the mask logic to the cells. The method may further include routing input data to the cells. Set and reset pulses for the cells may be selectively prevented or inhibited based on the mask logic.

23 Claims, 7 Drawing Sheets

| Bitwise Mask Logic |||||
|---|---|---|---|---|
| Data In | Old Data | Operations | setmask | resetmask |
| 0 | 0 | None | 1 | 1 |
| 0 | 1 | Reset | 1 | 0 |
| 1 | 0 | Set | 0 | 1 |
| 1 | 1 | None | 1 | 1 |

FIG. 1

PHASE CHANGE MEMORY MASK

TECHNICAL FIELD

Embodiments described herein relate generally to phase change memory.

BACKGROUND

Phase change memories use phase change materials, (i.e., materials that may be electrically switched between amorphous and crystalline states), as an electronic memory. One type of memory element utilizes a phase change material that may be, in one application, electrically switched between generally amorphous and generally crystalline local orders or between detectable states of local order across the entire spectrum between completely amorphous and completely crystalline states.

Typical materials suitable for such an application include various chalcogenide elements. The state of the phase change materials is also non-volatile. When the memory is set in either a crystalline, semi-crystalline, amorphous, or semi-amorphous state representing a resistance value, that value is retained until reprogrammed, even if power is removed. This is because the program value represents a phase or physical state of the material (e.g., crystalline or amorphous).

The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

BRIEF DESCRIPTION OF THE DRAWINGS

Features and advantages of the disclosure will be apparent from the detailed description which follows, taken in conjunction with the accompanying drawings, which together illustrate, by way of example, features of the disclosure; and, wherein:

FIG. 1 illustrates a table of bitwise mask logic in accordance with an example;

Figure 2:
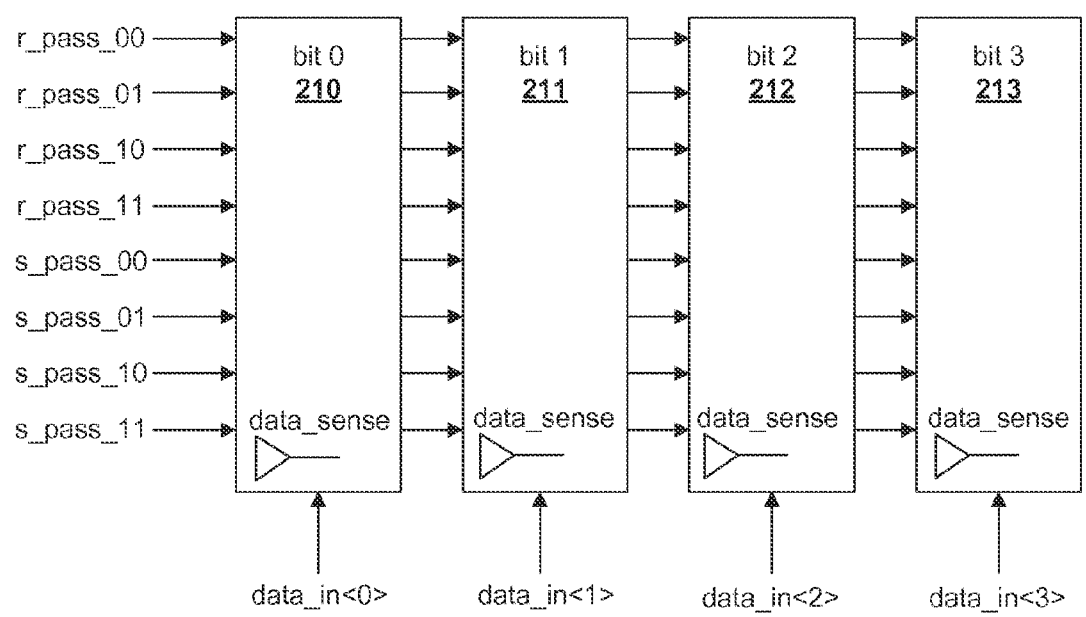
FIG. 2 illustrates a block diagram of a memory array in accordance with an example.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence.

Example Embodiments

An initial overview of technology embodiments is provided below and specific technology embodiments are then described in further detail. This initial summary is intended to aid readers in understanding the technology more quickly but is not intended to identify key or essential features of the technology nor is it intended to limit the scope of the claimed subject matter.

Phase change memory is capable of relatively fast bit-alterable writes, such as compared to NAND memory. However, phase change memory write speeds may be slower than DRAM (Dynamic Random-Access Memory) write speeds. A goal of phase change memory designers is to provide for read and write speeds which may be comparable to DRAM while maintaining an area/die size comparable to NAND, while also keeping energy reasonably low. For example, a cost of the relatively fast write speed of phase change memory as compared to NAND memory is higher per-bit energy than is used in NAND technologies.

Certain embodiments of the present technology provide programmable write mask architecture for phase change memory that allows selective configuration of desired write behavior. For example, write data mask behavior for each of the bits in an array may be configured from a central location. Different configurations can be used for different write algorithms, and behavior can be reconfigured post-silicon using fuses.

Referring to FIG. 1, a table 100, including bitwise mask logic is illustrated in accordance with an example of the present technology. According to the table 100 in FIG. 1, any combination of incoming desired data and previously sensed data may allow or inhibit a subsequent set or reset pulse. For example, a sequence controller may send mask logic to cells in an array. The different settings in the logic (such as the eight settings illustrated in the table of FIG. 1) can be placed in fuses, temporary registers, or other storage for individual cells. It is noted that the logic in FIG. 1 is exemplary and various different configurations may be implemented to allow different operations at the cells when incoming data is received depending on the current mask.

The table in FIG. 1 illustrates different potential combinations of incoming and existing data (shown as "Data In" and "Old Data" respectively). A "1" in data may indicate that a bit is set or is to be set while a "0" in data may indicate that a bit is reset or to be reset. Various operations may be performed based on a desired programming method or based on how the incoming data compares with the existing data. For example, where incoming data and existing data are the same for a given bit, such as both incoming data and existing data indicating a "1" or a "0", no programming may be performed on the bit. Where existing data is a "1" and incoming data is a "0", the bit may be reset. Where existing data is a "0" and incoming data is a "1", the bit may be set.

The mask may include a number of configurations for setting and/or resetting a bit. A "1" in the mask may indicate to inhibit an action, such as set or reset actions. A "0" in the mask may indicate to allow an action. Thus, setmask settings may include, for example:

s_pass_00=1 (data in=0, existing data=0, inhibit set);
s_pass_01=1 (data in=0, existing data=1, inhibit set);
s_pass_10=0 (data in=1, existing data=0, allow set); and
s_pass_11=1 (data in=1, existing data=1, inhibit set).

Similarly, resetmask settings may include, for example:

r_pass_00=1 (data in=0, existing data=0, inhibit reset);
r_pass_01=0 (data in=0, existing data=1, allow reset);
r_pass_10=1 (data in=1, existing data=0, inhibit reset); and
r_pass_11=1 (data in=1, existing data=1, inhibit reset).

The table 100 of FIG. 1 may be a programmable truth table for bitwise mask logic that may be reprogrammed to configurations different than the configuration illustrated in order to perform different options based on a desired programming method, some examples of which are described later. Also, while the table of FIG. 1 illustrates the use of eight mask settings (including four setmask settings and four resetmask settings), a different number of settings may also be used to implement various embodiments of the present technology.

Referring to FIG. 2, it can be seen that the settings defined by the mask may be routed to the bits or cells in an array. For example each of the settings (r_pass_00 through s_pass_11) may be routed to each of the bits 210-213 (i.e., bit 0 through bit 3). While FIG. 2 illustrates four bits in an array, any number of bits may be included in an individual array and an actual implementation may include many more bits than the simplified example illustrated.

Each of the bits in the array may include a sense amplifier or sense latch (i.e., "data_sense") that holds data read from the array (i.e., existing data, or "old data" as in FIG. 1). A separate data_in signal (data_in<0> through data_in<3>) may be routed to each bit. Each bit can have any of the 4 combinations of data_in and data_sense (i.e., "00", "01", "10" and "11").

Figure 3:
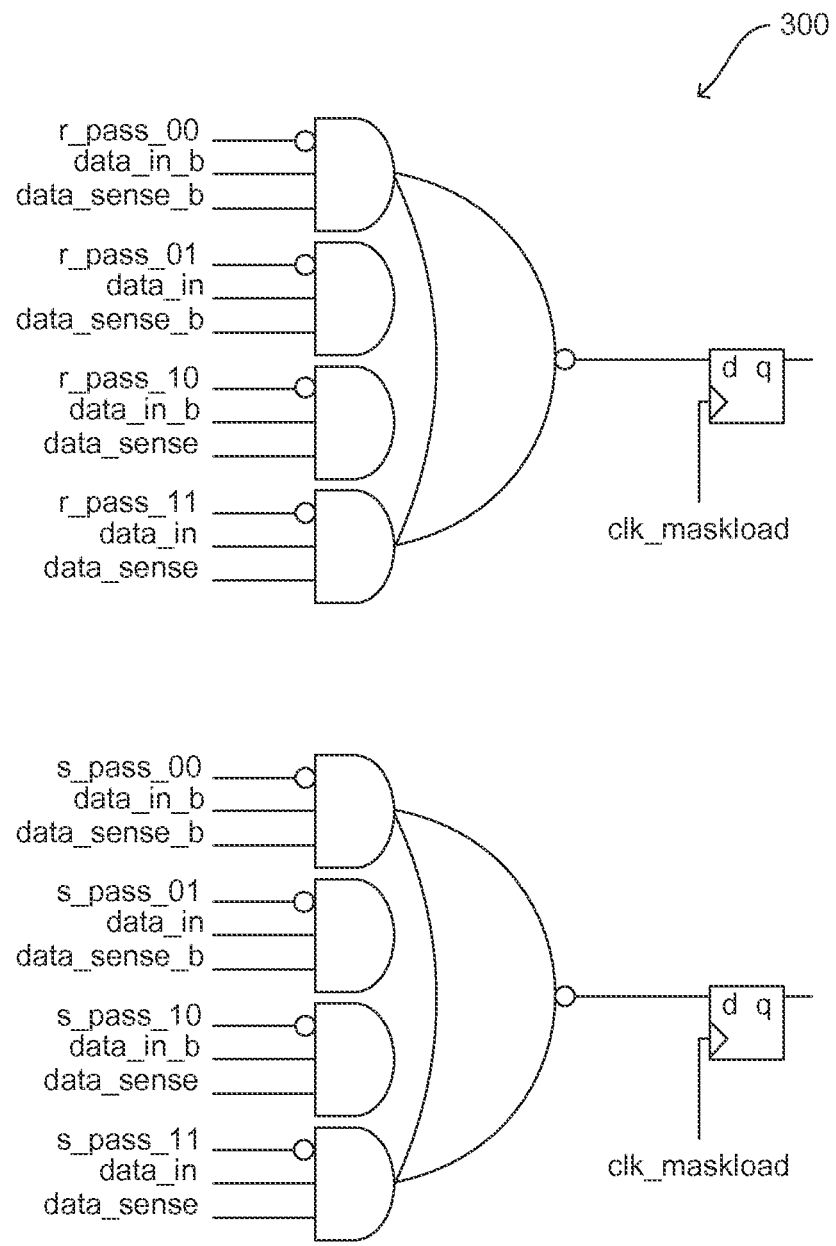
FIG. 3 illustrates a memory receiver in accordance with an example.

Referring to FIG. 3, within each bit may be a receiver 300 for receiving the mask configuration. The receiver 300 may evaluate the combination of data_in and data_sense along with the eight global mask signals r_pass_00/01/10/11 and s_pass_00/01/10/11. The receiver 300 may determine whether to inhibit or prevent (i.e., "mask out") a set pulse or a reset pulse based on the combination of data_in and data_sense along with the eight global mask signals. The set and reset masks may be latched into the receiver with a global clk_maskload signal. When a write operation begins, the write operation may apply set and reset pulses to the bits that have clear or uninhibited masks for setting or resetting. In other words, bits that allow a set operation will have a set write operation applied thereto and bits that allow a reset operation will have a reset write operation applied thereto. In the example illustrated, the receiver 300 includes one or more AND-OR-INVERT gates followed by an inverter for set and reset mask applications. However, the receiver 300 may also be implemented with different logic gates. In practice, the receiver 300 may receive a mask configuration from a sequence controller or other device configured to define or dictate the mask configuration. The receiver 300 may receive the existing data (i.e., data_sense) and the incoming data (i.e., data_in) in parallel with receipt of the mask configuration. The receiver 300 may then evaluate the existing and incoming data in light of the received mask configuration to determine whether to allow or inhibit a set action and whether to allow or inhibit a reset action.

Previous technologies have implemented write masking, but the write masking has been hard-wired into write circuits. For example, some NOR gate memory designs may use a single write mask bit that either allows programming or not. However, phase change memory technology is not as mature as NAND and DRAM technologies and thus may have to be more flexible with how the read and write methods are implemented as compared to read and write algorithms for NAND and DRAM. Embodiments of the present technology provide examples of flexibility, where write masking is not hard-wired into write circuits, but is instead programmable and reconfigurable, even at run time. It is noted that some memory devices utilizing certain embodiments of the present technology, while having programmable write masks, may be programmed to operate in a defined manner without enabling run-time variations. For example, a memory device may be manufactured and then tested to determine which of a plurality of programming methods performs best for the memory device and then such programming method may be implemented via the programmable mask. Some example programming methods will now be described.

To decrease overall write energy, previous or existing data in an array may be read and compared to incoming data. If a bit state is changed from the existing data to the incoming data, then such bits may be programmed, but programming may be avoided when the existing data and the incoming data for a particular cell matches. For example, if a cell in the array is set ("1"), and the incoming bit data indicates a "1", an operation may not be performed on this bit. The data may be left unchanged so that energy is not spent programming this bit. On average, considering random previous data in the array and random incoming data, 25% of the bits will be set and 25% reset. Thus, such a programming strategy may reduce energy costs by as much as 50% on average. To see this energy reduction, there may be circuits that store the set and reset rules for every bit programmed in parallel. This example may be implemented through the programmable mask using a truth table similar to the table (100) of FIG. 1.

It is noted, however, that there may be situations where using an energy-saving programming method is not desired. For example, a user may desire to ignore the existing array data and write data to the array based on the incoming pattern regardless of what may be currently programmed. Such a strategy may be used, for example, to reset all the cells first and then set some of the cells based on an incoming data pattern. As another example, such a strategy may be used alternatively to first set all the cells and then reset some of the cells based on an incoming data pattern. In another example, no cells may be set, and cells that are a "0" in the incoming data pattern may be reset.

As has been described previously, the selection of programming methods for programming the cells may be performed post-manufacture, as desired. In some instances, manufactured memory chips may exhibit unforeseen difficulties with programming cells as desired. However, using various embodiments of the present technology, a programming method may be changed post-manufacture to a different programming method that may not exhibit the same unforeseen difficulties.

In one example, programming profiles can be saved for different programming methods (such as a standard low-energy write, a force write, and so forth, as example programming methods). These profiles can be reconfigured post-manufacture to change the write behavior of the memory device. The profiles may be implemented or routed to the cells in an array to change the write behavior for different write operations (e.g., a standard write versus a force write) or to address a technology limitation post-manufacture (e.g., lowest energy for set bits but force write for reset bits).

In some examples, a system may include circuitry, software or firmware to periodically change a mask. In other words, a sequence controller or other device may generate or route mask settings which change at predetermined intervals or when predetermined conditions are met, such as for write operations when data integrity is considered more important than writing with low energy consumption, or when a threshold level of read errors is exceeded and a force write is desired. In one example, mask settings may be routed to the cells in parallel with each receipt of incoming data at the cells. In another example, mask settings may be stored at the receiver until new mask settings are received, such as when the settings are to be changed for a particular write operation.

Embodiments of the present technology allow the use of more than one write masking method. Embodiments of the present technology also allow the write masks to be reconfigured for different chip operations or to implement write procedures differently. In addition, certain embodiments of the present technology may provide for one or more global configurations of the masking logic that can be changed dynamically or may be saved without changing. The mask configurations can facilitate set or reset pulsing based on any combination of individual bit data in and existing data. The mask configuration receiver in each bit's control circuit can change the behavior of the write masking based on the mask configuration received.

Figure 4:
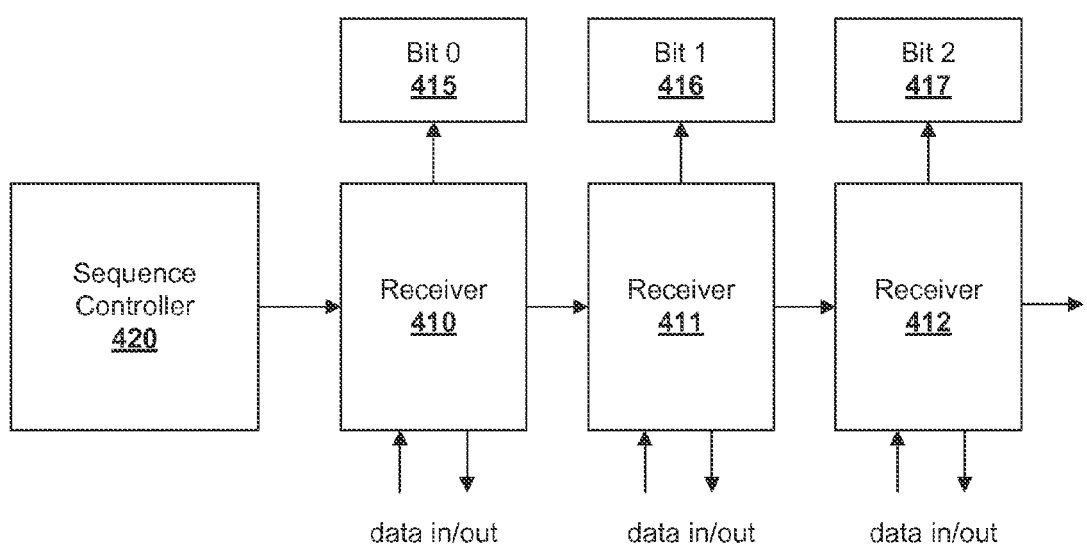
FIG. 4 illustrates a memory system diagram in accordance with an example.

Referring to FIG. 4, in one embodiment, the present technology may further be utilized to improve phase change memory write time, area, and energy using a single thread controller to perform simultaneous reset and set pulses.

Conventional memory technologies perform write operations with serially executed reset and set pulses. However, performing reset and set operations at the same time can improve write time for phase change memory. The simultaneous set and reset operations can be performed with a single-thread controller because the set pulse is longer than the reset pulse. For example, the set pulse may be started on some bits, the reset pulse concurrently or subsequently started and then ended on some bits, and afterward the set pulse may be ended on the bits that had the set pulse running. In accordance with embodiments of the present technology, the per-bit masks allow each bit to "know" whether to respond to the controller's signals to allow a set pulse, to allow a reset pulse, or to ignore the set and reset pulses (i.e., to inhibit the bit).

FIG. 4 illustrates a system including a sequence controller 420 for routing a mask configuration to individual cells 415-417 (bit 0 through bit 2), or rather to a receiver 410-412 for the cells 415-417. Data can be read in or out of the cells 415-417 via the receivers 410-412. A single, single-threaded sequence controller 420 may be used to facilitate faster writes by doing a reset pulse at the same time as a set pulse without compromising die area or energy reduction techniques. The area may be kept low by using small circuits that repeat every bit (e.g., mask configuration data), and large circuits (e.g., flexible voltage sequence controller) kept to a single thread with an area amortized over many bits. Energy may be kept low by maintaining bit alterability and the reduction of bits' set and reset pulses without compromising area or write speed.

Figure 5:
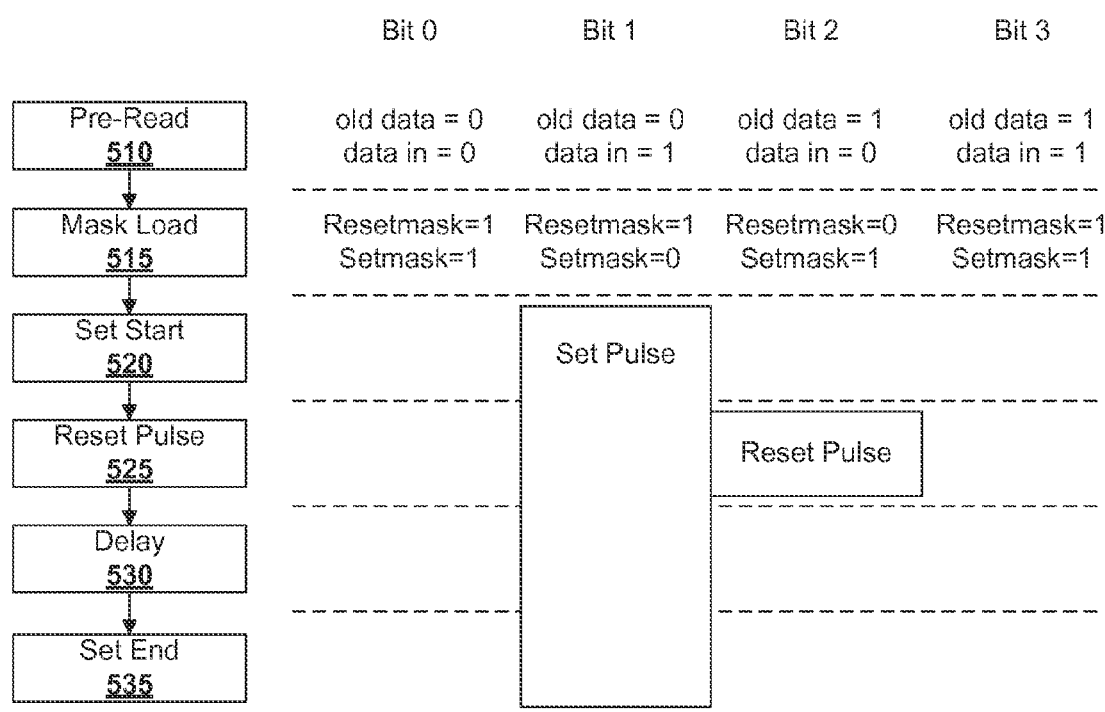
FIG. 5 illustrates application of a mask to allow a set pulse and reset pulse on uninhibited bits in accordance with an example.

FIG. 5 illustrates an example architecture implementation of a reset pulse during a set pulse using serially-executed macros. A single sequence controller may generate current/voltage sequence signals. The signals may be sent to many receivers. The receivers can hold a reset_mask and set_mask that determines whether the bit for a particular receiver will accept signals from the controller and send the signals to the bit or whether the receiver will ignore the signals and inhibit the signals from reaching the bit.

In FIG. 5, pre-read 510 and mask load 515 operations may be run on bits in parallel. The pre-read operation 510 may load the existing data (i.e., "old data") as well as the incoming data (i.e., "data in"). Additionally, the pre-read operation 510 may receive mask configuration data in parallel with the old data and data in. The mask load operation 515 may load a mask by using the old and incoming data to determine whether to make the reset_mask and set_mask "0" (i.e., allow a reset or set operation for that bit) or "1" (i.e., do not allow a reset or set operation for that bit). The logic for that may follow a truth table, such as the table illustrated in FIG. 1.

A macro may be run in the controller that sends signals to begin a set pulse (i.e., "set start" 520). These signals may be received on bits that have a mask with set_mask=0. Bit 1 in this example has a set mask equal to 0. Other bits with set_mask=1 will ignore the set start signal. A reset macro may be run in the controller that sends signals to do the reset pulse 525. These signals may be received for bits with reset_mask=0. Bit 2 in this example has a reset mask equal to 0. Other bits with reset_mask=1 will ignore the reset start signal. In the illustrated example, bits 0 and 3 have set_mask=1 and reset_mask=1 and will thus ignore the set and reset signals.

A single operation, such as set or reset, may be performed on a given cell at a given time. The bit logic may be designed such that if a reset pulse is received while the set pulse is running, the reset pulse will be inhibited. Thus, bits which are to be set may optionally have both set_mask=0 and reset_mask=0 without detrimental effect since the reset cannot be performed on the bits being set while the bits are being set.

Because the set operation may be longer in time duration than the reset operation, a delay 530 may be provided for the bits running the set pulse to continue. After the delay, the set pulse may be ended 535.

In some examples, a set pulse may have a sufficient duration that multiple reset pulses may be sent to an individual bit during the duration of a single set pulse. For instance, if a desired voltage threshold is not reached at the bit to be reset after an initial reset pulse, a subsequent reset pulse may be sent in place of or during the delay while waiting for the set pulse to be completed in order to achieve the desired voltage threshold.

It is noted that NOR and NAND memory designs do not allow programming while erasing (e.g., reset during set) due to technology limitations. For example, in NOR, write masks are 1 bit per cell and can only store a "program" or "do-not-program" value. NAND designs store multiple data per bit for multi-level cell programming, but the Vth placement operations on the array are done serially. Conventional phase change memory technologies may allow a bit-alterable write, but the set and reset pulses are controlled by global circuits and will perform the operations in series.

Rather than duplicate entire circuits and run each circuit in a different mode to implement simultaneous reset and set operations, in at least one embodiment, the present technology can use a single controller circuit and smaller repeated receivers. The receivers may store two bits of mask information to allow or block actions coming from the controller. The two bits of mask information may be determined based on received mask configuration signals, existing data and incoming data.

The simultaneous set and reset operations initiated serially may be accomplished through the programmable masks implemented in various embodiments of the present technology or using fixed or non-programmable masks.

In one embodiment, the phase change material used in the storage device may be suitable for non-volatile memory data storage. The phase change material may be a material having electrical properties (e.g., resistance) that may be changed through the application of energy such as, for example, heat, light, voltage potential, or electrical current.

Examples of phase change materials may include a chalcogenide material. A chalcogenide material may be a material that includes at least one element from column VI of the periodic table or may be a material that includes one or more of the chalcogen elements, e.g., any of the elements of tellurium, sulfur, or selenium. Chalcogenide materials may be non-volatile memory materials that may be used to store information that is retained even after electrical power is removed.

In one embodiment, the phase change material may be a chalcogenide element composition from the class of tellurium-germanium-antimony ($Te_xGe_ySb_z$) material or a GeSbTe alloy, such as type 2,2,5 although other suitable chalcogenide materials may be used and should be considered within the scope of the disclosure.

In one embodiment, if the memory material is a non-volatile, phase change material, the memory material may be programmed into one of at least two memory states by applying an electrical signal to the memory material. An electrical signal may alter the phase of the memory material between a substantially crystalline state and a substantially amorphous state, wherein the electrical resistance of the memory material in the substantially amorphous state is greater than the resistance of the memory material in the substantially crystalline state.

Programming of the memory material to alter the state or phase of the material may be accomplished by selecting the cell through applying a relatively low voltage, such as zero volts to the selected line and a current into the selected column, from one current source to reset a cell to a higher resistance or from another current source with a lower current or slower trailing edge to reset to a lower resistance, thereby generating a voltage potential across the memory material. An electrical current may flow through a portion of the memory material in response to the applied voltage potentials, and may result in heating of the memory material.

This controlled heating and subsequent controlled cooling may alter the memory state or phase of the memory material. Altering the phase or state of the memory material may alter an electrical characteristic of the memory material. For example, resistance of the material may be altered by altering the phase of the memory material. Either all or a portion of the phase change memory material may be altered during the writing pulse. In one example, a portion of memory material that undergoes phase change may be a region that is adjacent to an electrode contacting the storage device of the cell for storing the bit. The memory material may be a programmable resistive material or simply a programmable resistance material.

In one embodiment, a voltage pulse with a potential difference of about 1.5 volts may be applied across a portion of the memory material by applying about 0 volts to a line and a current of about 2 mA from a write current source into a different selected line. For example, the voltage on one selected line relative to another selected line may be positive, or the cell or voltages may be reversed. A current flowing through the memory material in response to the applied voltage potentials may result in heating of the memory material. This heating and subsequent controlled cooling, determined by the write current pulse trailing edge rate, may alter the memory state or phase of the material after the memory material is cooled, from higher to lower resistance, from lower to higher resistance, or to rewrite the existing state to reinforce the existing state.

In a "reset" state, the memory material may be in an amorphous or semi-amorphous state and in a "set" state, the memory material may be in a crystalline or semi-crystalline state. The resistance of the memory material in the amorphous or semi-amorphous state may be greater than the resistance of the material in the crystalline or semi-crystalline state. The association of reset and set with amorphous and crystalline states, respectively, is a convention. Other conventions may be adopted.

The information stored in memory material may be read by measuring the resistance of the memory material. As an example, a read current may be provided to the memory material using the selected row and column and a resulting read voltage across the memory material may be compared against a reference voltage. The resulting read voltage on the column may be proportional to the resistance exhibited by the selected memory storage device when a read current is forced into the column.

EXAMPLES

The following examples pertain to further embodiments.

Figure 6:
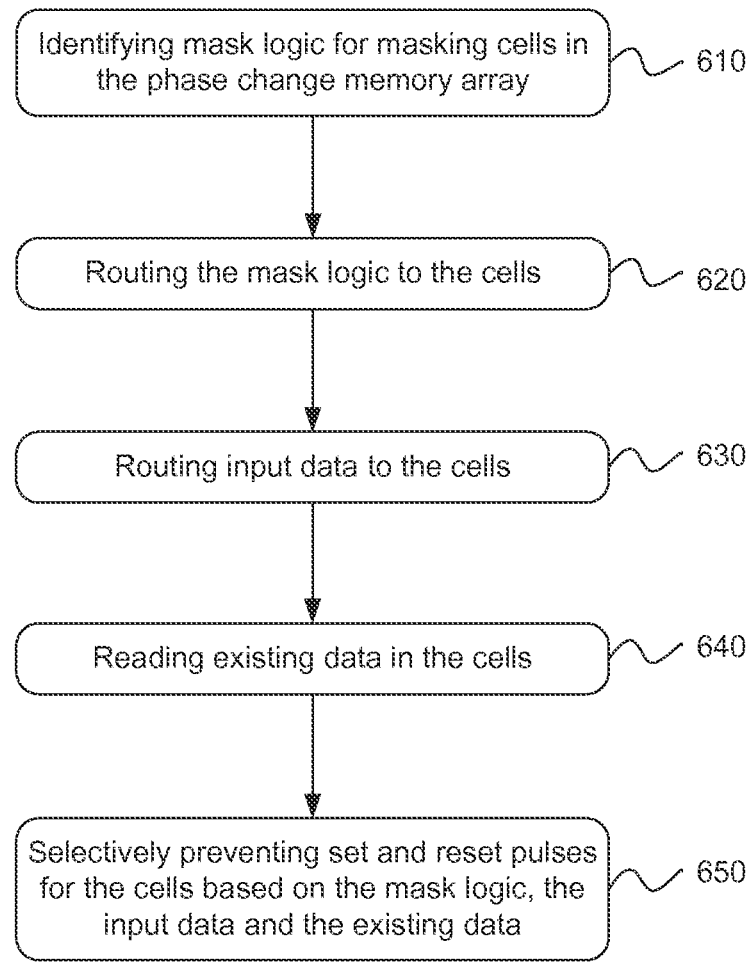
FIG. 6 illustrates a flow diagram of a method of writing data to a phase change memory array in accordance with an example.

With reference to FIG. 6, Example 1 is a flow diagram of a method for writing data to a phase change memory array in accordance with an example of the present technology. The method may include identifying 610 mask logic for masking cells in the phase change memory array and routing 620 the mask logic to the cells. The method may further include routing 630 input data to the cells. Existing data in the cells may be read 640. Set and reset pulses for the cells may be selectively prevented 650 or inhibited based on the mask logic, and further based on the input data and the existing data.

In one example of the method, the mask logic may be defined by a profile for an identified operation selected for bit-alterable writing to the phase change memory array. Any number of profiles with different mask logic may be available. In other words, the profile may be one of a plurality of profiles each associated with different mask logic. At least one of the plurality of profiles may be an energy saving profile and another at least one of the plurality of profiles may be a force write profile. At least one of the plurality of profiles may be a reset or set pulse minimizing profile and another at least one of the plurality of profiles may be a forced set or reset pulse applied to all cells profile. Other profiles are also contemplated and are considered to be within the scope of this disclosure.

In one example, the mask logic may be programmable. For example, the method may include altering an existing mask logic to an altered mask logic. The existing mask logic may be altered to an altered mask logic. The method may also include reverting the altered mask logic to the existing mask logic after the altered mask logic is routed to the cells. In some examples, the existing mask logic may be altered to the altered mask logic or the altered mask logic reverted to the existing mask logic at predetermined intervals. Logic for altering the mask logic or for alternating between mask logic may be based on time, read cycles, write cycles, cell measurement, or any of a variety of other factors.

In one example, a combination of existing data and the input data may be compared to the mask logic to obtain a result. A determination may be made as to whether to prevent a set or reset pulse based on the result.

In one example, the method may include sending a set pulse to set cells not inhibited by the mask logic, and subsequently sending a reset pulse to reset cells not inhibited by the mask logic before the set pulse is complete. The method may also include delaying further operations until the set pulse is complete and/or performing additional reset operations, or rather sending additional reset pulses, before the set pulse is complete.

Features of the systems or apparatuses described previously or later may also be implemented with respect to the method or any processes described herein, and vice versa. Also, specifics in the examples may be used anywhere in one or more embodiments.

Figure 7:
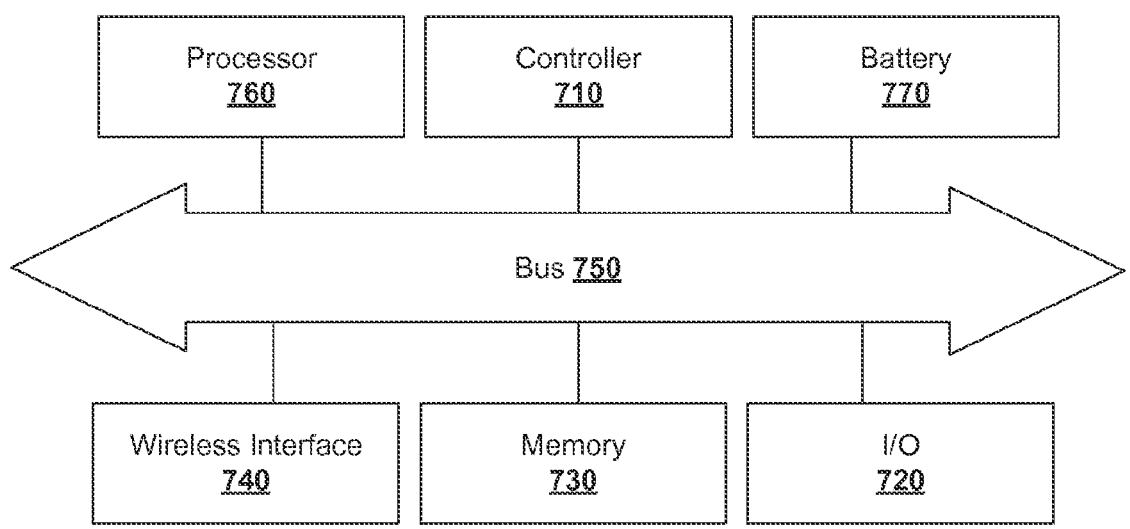
FIG. 7 illustrates a memory system diagram in accordance with an example.

In Example 2, and with reference to FIG. 7, a system 700 in accordance with an invention embodiment is provided. System 700 may be used in wireless or mobile devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 700 may be used in any of the following exemplary systems: a wireless local area network (WLAN) system, a wireless personal area network (WPAN) system, or a cellular network. System 700 may also be used in other systems not specifically recited.

System 700 may include a controller 710, an input/output (I/O) device 720 (e.g. a keypad, display), a memory 730, and a wireless interface 740 coupled to each other via a bus 750. A battery 770 or other power source may be used in some embodiments. It should be noted that such components are merely exemplary and other components not specifically recited could be used in place of or included along with one or more of the above-recited components.

Controller 710 may comprise, for example, one or more microprocessors, digital signal processors, microcontrollers, or the like. Memory 730 may be used to store messages transmitted to or by system 700. Memory 730 may also optionally be used to store instructions that are executed by controller 710 during the operation of system 700, and may be used to store user data. Memory 730 may be provided by one or more different types of memory. For example, memory 730 may comprise any type of random access memory, a volatile memory, a non-volatile memory such as a flash memory and/or a memory such as memory discussed herein.

I/O device 720 may be used by a user to generate a message. System 700 may use wireless interface 740 to transmit and receive messages to and from a wireless communication network with a radio frequency (RF) signal. Examples of wireless interface 740 may include an antenna, a wireless transceiver, or other signal transmitting/receiving devices.

In one example, the system 700 may include the processor 760, the power source or battery 770, and a phase change memory 730 coupled to the processor and including an array of cells. The controller 710 may be a sequence controller configured to route a mask to the array of cells. A mask receiver (not shown in FIG. 7) for individual cells in the array of cells may receive the mask, identify existing data, identify input data and determine whether to inhibit a set pulse or a reset pulse to the cells.

The mask may include eight signals defining operations to perform for the individual cells based on the existing data and the input data. The mask may be a programmable mask. The mask receiver may enable simultaneous set and reset operations on different cells in the array by the sequence controller. The sequence controller may perform or initiate the set and reset operations sequentially or simultaneously.

The controller 710 or sequence controller may further comprise a mask generator configured to route the mask to the mask receiver. The controller 710 may further be configured to generate the mask for routing to the mask receiver based on instructions received from the processor 760.

The system 700 may include a latch for loading the existing data in parallel with receipt of the mask at the mask receiver. The latch may be a part of the mask receiver.

In one example, the mask receiver may enable simultaneous set and reset operations on different cells in the array through sequential initiation by the sequence controller when the mask inhibits the reset pulse on at least one of the cells and inhibits the set pulse on a different at least one of the cells.

In Example 3, the represented embodiment of the present technology provides a phase change memory. The phase change memory may include an array of phase change memory cells and a mask receiver for individual cells in the array to receive a mask, identify existing data, identify input data and determine whether to inhibit a set pulse or a reset pulse. The mask may include up to eight or more signals defining operations to perform for the individual cells based on the existing data and the input data and may enable simultaneous set and reset operations on different cells in the array through sequential initiation by the sequence controller. The mask may include greater than eight signals, for example, when more than two states are present (i.e., set and reset states). The mask may include fewer than eight signals, for example, when an addressed bus is implemented, such that four signals are used to load the reset mask and then subsequently to load the set mask, or vice versa.

The individual cells may be configured to receive the mask and the input data in parallel. A latch may be included for loading the existing data in parallel with receipt of the mask at the mask receiver.

Various techniques, or certain aspects or portions thereof, may take the form of program code (i.e., instructions) embodied in tangible media, such as floppy diskettes, CD-ROMs, hard drives, non-transitory computer readable storage medium, or any other machine-readable storage medium wherein, when the program code is loaded into and executed by a machine, such as a computer, the machine becomes an apparatus for practicing the various techniques. Circuitry can include hardware, firmware, program code, executable code, computer instructions, and/or software. A non-transitory computer readable storage medium can be a computer readable storage medium that does not include signal. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, EPROM, flash drive, optical drive, magnetic hard drive, solid state drive, or other medium for storing electronic data. The node and wireless device may also include a transceiver module, a counter module, a processing module, and/or a clock module or timer module. One or more programs that may implement or utilize the various techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

It should be understood that many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions, which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. The modules may be passive or active, including agents operable to perform desired functions.

Reference throughout this specification to "an example" means that a particular feature, structure, or characteristic described in connection with the example is included in at least one invention embodiment. Thus, appearances of the phrases "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various invention embodiments and examples may be referred to herein along with alternatives for the various components thereof. It is understood that such embodiments, examples, and alternatives are not to be construed as de facto equivalents of one another, but are to be considered as separate and autonomous.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A phase change memory, comprising:
    an array of phase change memory cells; and
    a mask receiver for individual cells in the array to receive a mask, identify existing data, identify input data and determine whether to inhibit a set pulse.

2. The memory of claim 1, wherein the mask comprises signals defining operations to perform for the individual cells based on the existing data and the input data.

3. The memory of claim 1, wherein the mask is a programmable mask.

4. The memory of claim 1, wherein the mask receiver enables simultaneous set and reset operations on different cells in the array by a sequence controller.

5. The memory of claim 1, wherein the individual cells are configured to receive the mask and the input data in parallel.

6. The memory of claim 1, further comprising a latch for loading the existing data in parallel with receipt of the mask at the mask receiver.

7. The memory of claim 1, wherein the mask is defined by a profile for an identified operation selected for bit-alterable writing to the array of phase change memory cells.

8. The memory of claim 7, wherein the profile is one of a plurality of profiles each associated with different mask logic.

9. The memory of claim 8, wherein at least one of the plurality of profiles is a set or reset pulse minimizing profile and another at least one of the plurality of profiles is a set or reset pulse applied to all cells profile.

10. The memory of claim 9, wherein the profile is either a set or reset pulse minimizing profile.

11. A method of writing data to a phase change memory array, comprising:
    identifying mask logic for masking cells in the phase change memory array;
    routing the mask logic to the cells;
    routing input data to the cells; and
    selectively preventing set and reset pulses for the cells based on the mask logic.

12. The method of claim 11, further comprising comparing a combination of existing data and the input data to the mask logic to obtain a result; and determining whether to prevent a set or reset pulse based on the result.

13. The method of claim 11, further comprising: altering an existing mask logic to an altered mask logic.

14. The method of claim 13, further comprising reverting the altered mask logic to the existing mask logic after the altered mask logic is routed to the cells.

15. The method of claim 11, further comprising sending a set pulse to set cells not inhibited by the mask logic; and subsequently sending a reset pulse to reset cells not inhibited by the mask logic before the set pulse is complete.

16. The method of claim 15, further comprising delaying further operations until the set pulse is complete.

17. A data storage system, comprising:
    a processor;
    a power source;
    a phase change memory coupled to the processor and including an array of cells;
    a sequence controller to route a mask to the array of cells; and mask receivers at individual cells in the array of cells to receive the mask, identify existing data, identify input data and determine whether to inhibit a set pulse or a reset pulse to the cells.

18. The system of claim 17, wherein the mask comprises a plurality of signals defining operations to perform for the individual cells based on the existing data and the input data.

19. The system of claim 17, wherein the mask is a programmable mask.

20. The system of claim 17, wherein the mask receiver enables simultaneous set and reset operations on different cells in the array by the sequence controller.

21. The system of claim 17, wherein the sequence controller further comprises a mask generator configured to route the mask to the mask receiver.

22. The system of claim 17, further comprising a latch for loading the existing data in parallel with receipt of the mask at the mask receiver.

23. The system of claim 17, wherein the mask receiver enables simultaneous set and reset operations on different cells in the array by the sequence controller when the mask inhibits the reset pulse on at least one of the cells and inhibits the set pulse on a different at least one of the cells.

* * * * *